(12) United States Patent
Forbes

(10) Patent No.: US 8,461,002 B2
(45) Date of Patent: Jun. 11, 2013

(54) VERTICAL TRANSISTOR, MEMORY CELL, DEVICE, SYSTEM AND METHOD OF FORMING SAME

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 12/724,833

(22) Filed: Mar. 16, 2010

(65) Prior Publication Data
US 2010/0173460 A1    Jul. 8, 2010

Related U.S. Application Data

(63) Continuation of application No. 11/151,219, filed on Jun. 13, 2005, now Pat. No. 7,679,118.

(51) Int. Cl.
*H01L 21/336* (2006.01)

(52) U.S. Cl.
USPC ................................ 438/268; 257/E21.652

(58) Field of Classification Search
USPC .................................. 438/268; 257/E21.652
See application file for complete search history.

(56) References Cited

U.S. PATENT DOCUMENTS

| | | | |
|---|---|---|---|
| 5,072,269 A | 12/1991 | Hieda | |
| 5,155,059 A * | 10/1992 | Hieda | ........................... 438/155 |
| 5,693,552 A | 12/1997 | Hsu | |
| 5,891,773 A | 4/1999 | Saitoh | |
| 6,097,065 A | 8/2000 | Forbes et al. | |
| 6,114,725 A | 9/2000 | Furukawa et al. | |
| 6,150,687 A * | 11/2000 | Noble et al. | ................... 257/302 |
| 6,320,222 B1 * | 11/2001 | Forbes et al. | ................. 257/331 |
| 6,355,520 B1 | 3/2002 | Park et al. | |
| 6,355,961 B1 | 3/2002 | Forbes | |
| 6,399,979 B1 | 6/2002 | Noble et al. | |
| 6,420,751 B1 | 7/2002 | Maeda et al. | |
| 6,440,801 B1 * | 8/2002 | Furukawa et al. | ............ 438/272 |
| 6,476,434 B1 | 11/2002 | Noble et al. | |
| 6,573,545 B2 | 6/2003 | Kim et al. | |
| 6,689,660 B1 * | 2/2004 | Noble et al. | ................... 438/268 |
| 6,747,305 B2 | 6/2004 | Forbes et al. | |
| 6,841,438 B2 | 1/2005 | Bissey et al. | |
| 7,303,833 B2 * | 12/2007 | Cortright et al. | ............... 429/495 |
| 7,371,627 B1 * | 5/2008 | Forbes | ........................... 438/197 |
| 2001/0041438 A1 | 11/2001 | Maeda et al. | |
| 2002/0149048 A1 * | 10/2002 | Noble et al. | ................... 257/302 |
| 2004/0004245 A1 * | 1/2004 | Forbes et al. | ................. 257/315 |
| 2004/0041189 A1 * | 3/2004 | Voshell et al. | ................. 257/297 |
| 2004/0089893 A1 * | 5/2004 | Bissey et al. | ................... 257/302 |
| 2006/0134488 A1 * | 6/2006 | Cortright et al. | ................. 429/30 |
| 2006/0172483 A1 * | 8/2006 | Forbes | ........................... 438/212 |
| 2007/0004134 A1 | 1/2007 | Vora | |

\* cited by examiner

*Primary Examiner* — Robert J Hoffberg
*Assistant Examiner* — Igwe U Anya
(74) *Attorney, Agent, or Firm* — TraskBritt

(57) ABSTRACT

A memory device, system and fabrication method relating to a vertical memory cell including a semiconducting pillar extending outwardly from an integrally connected semiconductor substrate are disclosed. A first source/drain region is formed in the substrate and a body region and a second source/drain region are formed within the pillar. A first gate is coupled to a first side of the pillar for coupling the first and second source/drain regions together when activated. The vertical memory cell also includes a storage capacitor formed on an extended end of the semiconducting pillar and electrically coupled to the second source/drain region.

20 Claims, 13 Drawing Sheets

VERTICAL TRANSISTOR, MEMORY CELL, DEVICE, SYSTEM AND METHOD OF FORMING SAME

CROSS-REFERENCE TO RELATED APPLICATION

This application is a divisional of application Ser. No. 11/151,219, filed Jun. 13, 2005, now U.S. Pat. No. 7,679,118, issued Mar. 16, 2010, the entire disclosure of which is hereby incorporated herein by this reference.

BACKGROUND OF THE INVENTION

1. Field of the Invention

The present invention relates generally to semiconductor integrated circuits and, more particularly, to circuits and methods for dual-gated transistors.

2. State of the Art

Leakage current is a significant concern and problem in low-voltage and low-power battery-operated CMOS circuits and systems, and particularly in dynamic random access memories (DRAMs). As shown in FIG. 1, if low voltages are used for low-power operation of electronic circuits or devices, then a problem exists with threshold voltages and standby leakage current. To get significant overdrive and reasonable switching speeds, the threshold voltage magnitudes must be small, even near zero volts. However, when such small threshold voltages are used, the transistor will have a large sub-threshold leakage current. Various techniques have been employed to allow low-voltage operation with CMOS transistors that can have a relatively large variation in threshold voltage, but yet have low sub-threshold leakage currents in a standby state. Gate body-connected CMOS transistors in vertical device structures provide a dynamic or changing threshold voltage, i.e., lower threshold voltage when the transistor is on and a higher threshold voltage when the vertical transistor is off.

Transistors in CMOS circuits, and in particular CMOS circuits in semiconductor memories, are subjected to continuous reduction in dimensions to accommodate increasing transistor densities. It is known that semiconductor memories, comprised of CMOS circuits, are widely used in computer systems for storing data. A DRAM memory cell typically includes an access field-effect transistor (FET) and a storage capacitor. The access FET allows the transfer of data charges to and from the storage capacitor during reading and writing operations. The data charges on the storage capacitor are periodically refreshed during a refresh operation.

Memory density is typically limited by a minimum lithographic feature size (F) that is imposed by lithographic processes used during fabrication. For example, one generation of high-density dynamic random access memories (DRAMs), which are capable of storing 512 Megabits of data, require an area of 4 $F^2$ per bit of data. There is a need in the art to provide even higher density memories in order to further increase data storage capacity and reduce manufacturing costs. Increasing the data storage capacity of semiconductor memories requires a reduction in the size of the access transistor and storage capacitor of each memory cell. However, other factors, such as sub-threshold leakage currents, require attention in order to lower the overall power consumed by the integrated circuits. There is also a need in the broader integrated circuit art for dense structures and fabrication techniques.

BRIEF SUMMARY OF THE INVENTION

The present invention, in exemplary embodiments, relates to a vertical transistor, memory cell, device, system and method of forming the same. In one embodiment of the present invention, a memory cell is provided. The memory cell includes a pillar of semiconductor material including a plurality of sides extending from a general plane of the substrate. A first source/drain region is formed in the substrate and an access transistor including a body region and a second source/drain region is formed within the pillar.

In another embodiment of the present invention, a memory device is provided that includes an array of memory cells, with each memory cell including a pillar of semiconductor material. The pillar of semiconductor material further includes a plurality of sides that extends from a general plane of the substrate. A first source/drain region is formed in the substrate, and an access transistor including a body region and a second source/drain region are formed within the pillar. The access transistor includes at least a first gate on a first side of the pillar. The memory device further includes a plurality of bit lines implanted into the substrate, with each of the plurality of bit lines being in conductive contact with the first source/drain region of the access transistor of at least a plurality of memory cells in a common column of the array. A plurality of word lines is also disposed generally orthogonal to the plurality of bit lines.

In a further embodiment of the present invention, an integrated circuit is provided. The integrated circuit includes a pillar of semiconductor material integral with and extending generally orthogonal from a general plane of the substrate. The integrated circuit further includes an access transistor including a first source/drain region formed in the substrate and a second source/drain region formed on the pillar. An interconnection line is formed integral to the first source/drain region in the substrate.

In yet another embodiment of the present invention, a vertical memory cell is provided. The vertical memory cell includes a semiconducting pillar extending outwardly from an integrally connected semiconductor substrate. A first source/drain region is formed in the substrate, and a body region and a second source/drain region are formed within the pillar. A first gate is coupled to a first side of the pillar for coupling the first and second source/drain regions together when activated. The vertical memory cell also includes a storage capacitor formed on an extended end of the semiconducting pillar and electrically coupled to the second source/drain region.

In yet a further embodiment of the present invention, a semiconductor substrate is provided. The semiconductor substrate has fabricated thereon a semiconductor memory. The semiconductor memory includes an array of memory cells, with each memory cell including a pillar of semiconductor material including a plurality of sides extending from a general plane of the substrate. The semiconductor memory includes a first source/drain region formed in the substrate, and an access transistor including a body region and a second source/drain region are formed within the pillar. The access transistor includes at least a first gate on a first side of the pillar. A plurality of bit lines is implanted into the substrate, with each of the plurality of bit lines in conductive contact with the first source/drain region of the access transistor of at least a plurality of memory cells in a common column of the array. A plurality of word lines is disposed generally orthogonal to the plurality of bit lines and the plurality of word lines is coupled to the first gates of memory cells immediately adjacent to each of the plurality of word lines.

In yet another embodiment of the present invention, an electronic system is provided and includes an input device, an output device, a memory device, and a processor device coupled to the input, output, and memory devices. At least one of the input, output, memory, and processor devices includes a memory cell, with the memory cell comprising a pillar of semiconductor material including a plurality of sides and extending from a general plane of a substrate. The memory cell further includes a first source/drain region formed in the substrate and an access transistor including a body region and a second source/drain region formed within the pillar.

In a yet further embodiment of the present invention, a method of forming a memory cell is provided. The method includes forming a pillar of semiconductor material including a plurality of sides and extending from a general plane of a substrate. A first source/drain region is formed in the substrate and an access transistor including a body region and a second source/drain region is formed within the pillar.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The following detailed description is not to be taken in a limiting sense, and the scope of the present invention is defined only by the appended claims.

Figure 1:
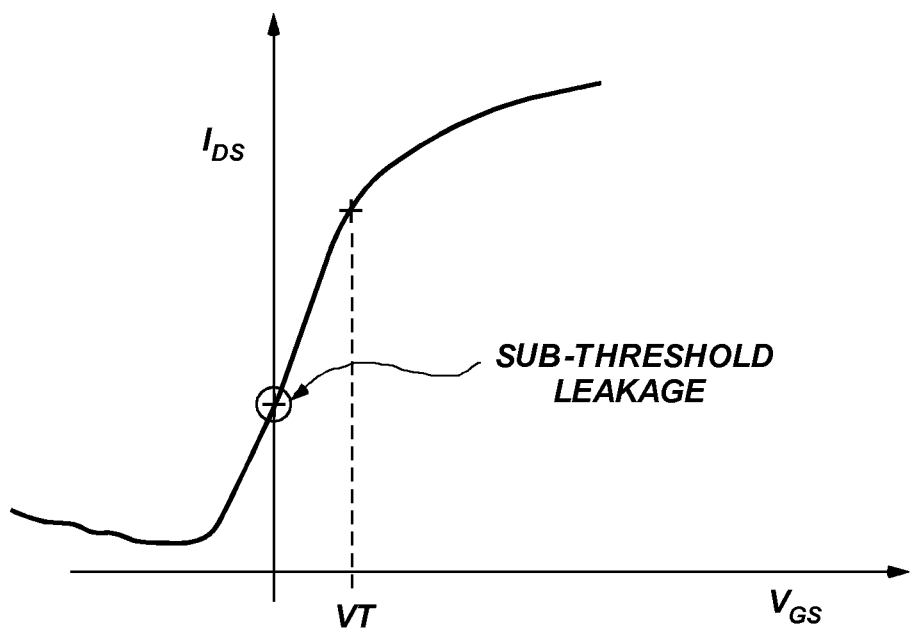
FIG. 1 is a representative graph of sub-threshold leakage current as a function of the gate-to-source voltage of a transistor.
Figure 2:
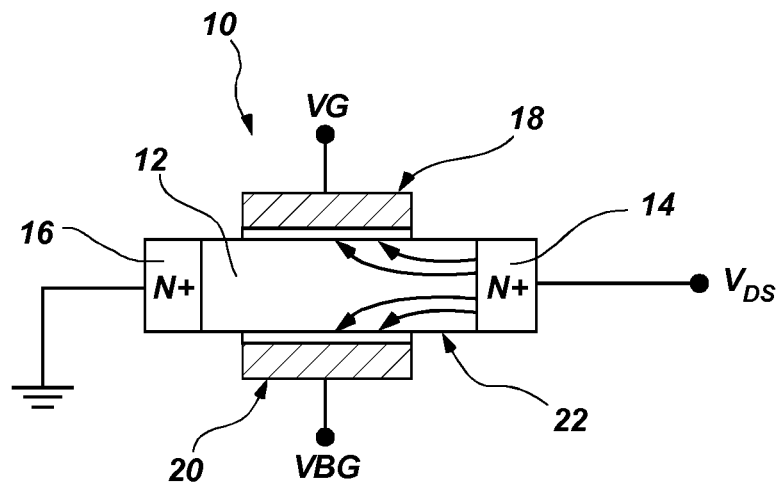
FIG. 2 is a simplified functional diagram of a dual-gated transistor, in accordance with an embodiment of the present invention.

FIG. 2 illustrates a simplified functional diagram of a dual-gated transistor, in accordance with an embodiment of the present invention. A dual-gated transistor 10 includes a semiconductor body 12 having a drain 14 and a source 16 on opposing ends of a channel formed therebetween. A first gate 18 and a second gate 20 provide activation of the dual-gated transistor 10. When the dual-gated transistor 10 turns off, the sub-threshold current is reduced more quickly as the gate voltages are reduced. Such a reduction is due in part to the fully depleted nature of the dual-gated transistor 10. A dual-gated arrangement for a transistor provides improved characteristics over conventional bulk silicon transistors due, in part, to gate electrodes present on both sides of the channel, rather than only on a single side as in a conventional planar bulk silicon transistor.

Figure 3:
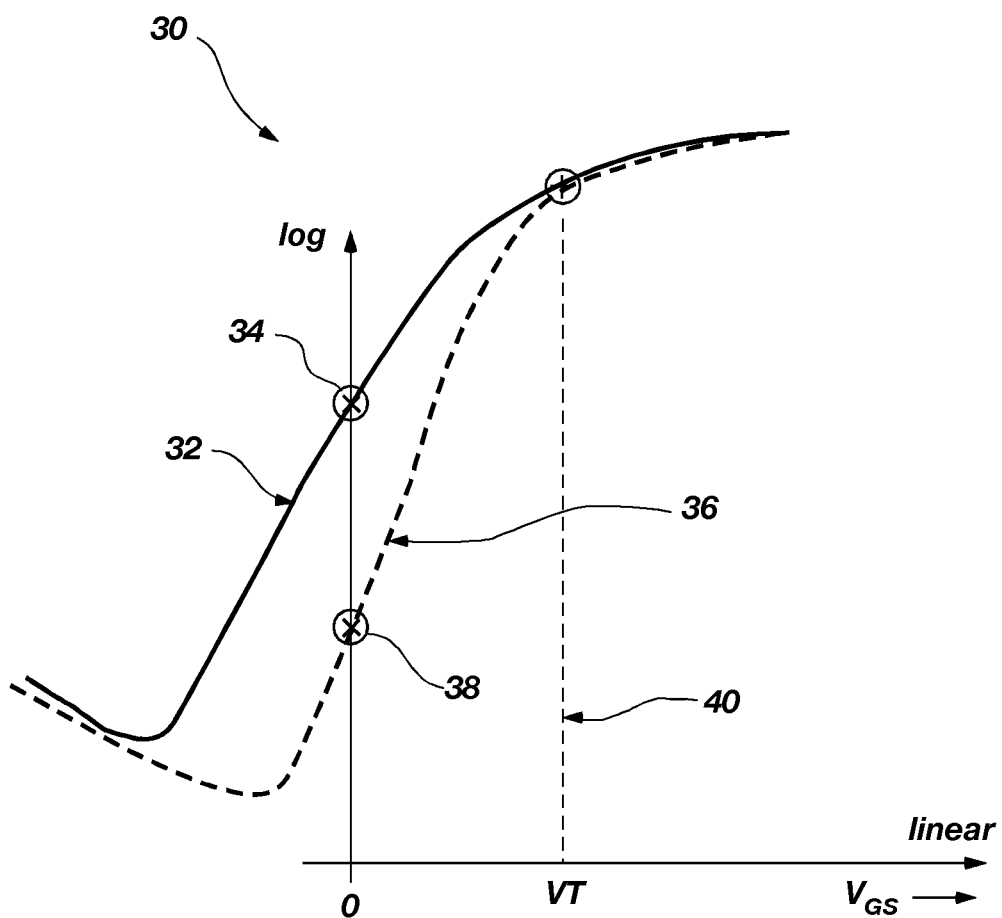
FIG. 3 is a representative comparative graph of sub-threshold leakage current as a function of the gate-to-source voltage for a single-gated bulk transistor and a dual-gated transistor, in accordance with an embodiment of the present invention.

When a first gate 18 and a second gate 20 are present, the electric field 22 generated by the drain 14 is better screened from the source 16 at the end of the channel. Such a screening results in an improved sub-threshold leakage current as illustrated with respect to the representative comparative graph of the sub-threshold leakage current illustrated in FIG. 3. In FIG. 3, a graph 30 illustrates a typical leakage current plot 32 of a conventional planar bulk silicon transistor. It should be noted that a conventional bulk silicon transistor at point 34, where the gate voltage equals zero, exhibits a significant amount of leakage current in the region below the threshold line 40. In contrast, a dual-gated transistor 10 exhibits a reduced sub-threshold leakage current illustrated with respect to the dual-gated transistor leakage current plot 36, which denotes a significant reduction in leakage current at point 38 where the gate voltage equals zero.

Figure 4:
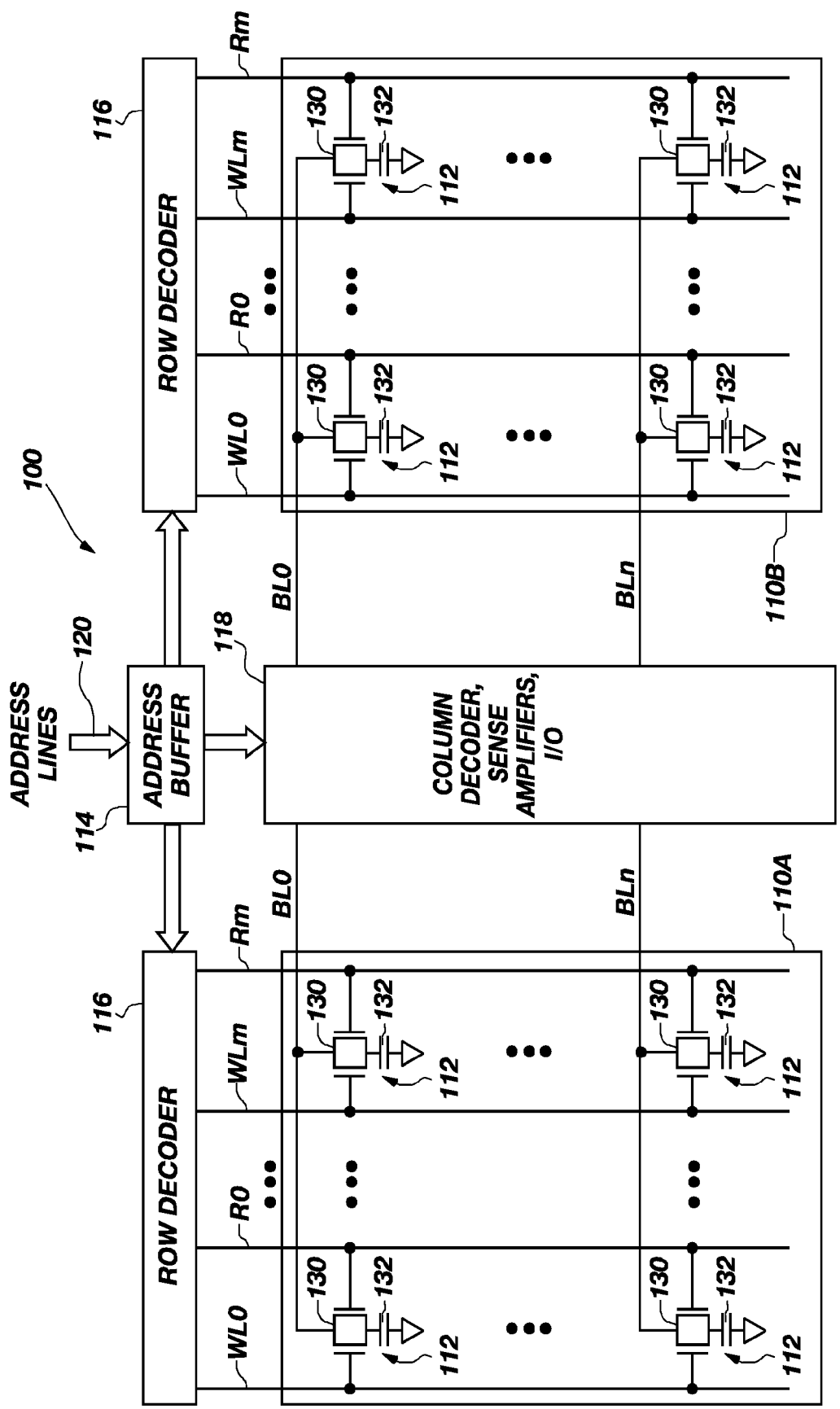
FIG. 4 is a schematic diagram illustrating a semiconductor memory incorporating a dual-gated transistor, in accordance with an embodiment of the present invention.

FIG. 4 is a schematic illustrating generally an embodiment of an integrated circuit 100 (also referred to as "circuit 100"), such as a semiconductor memory device, incorporating an array of memory cells provided by the invention. In FIG. 4, circuit 100 illustrates, by way of example and not limitation, a dynamic random access memory (DRAM), but the invention also comprises other integrated circuits including other semiconductor memory devices. In this exemplary embodiment, circuit 100 includes memory cell arrays 110, such as 110A and 110B. Each memory cell array 110 includes M rows and N columns of memory cells 112.

In the exemplary embodiment of FIG. 4, each memory cell includes an access transistor 130 or transfer device, such as an n-channel cell access field-effect transistor (FET) or any other transistor or switching device having more than one control terminal input. More particularly, access transistor 130 includes first and second gate terminals for controlling conduction between its first and second source/drain terminals.

Access transistor 130 is coupled at a second source/drain terminal to a storage node of a storage capacitor 132. The other terminal of storage capacitor 132 is coupled to a reference voltage such as a ground voltage VSS (not shown). Each of the M rows includes one of word lines WL0, WL1 . . .

WLm-1, WLm coupled to the first gate terminals of access transistors 130 or to one of the control terminals of an equivalent switching device. Each of the M rows also includes one of word lines R0, R1, R2, . . . , Rm-1, Rm coupled to the second gate terminals of access transistors 130 in memory cells 112. Thus, the term "word line" includes any interconnection line between gate terminals of access transistors 130 or the control terminals of equivalent switching devices. Each of the N columns includes one of bit lines BL0, BL1 . . . BLn-1, BLn.

Bit lines BL0-BLn function to write data to and read data from memory cells 112. Word lines WL0-WLm and—R0-Rm function to activate access transistors 130 to access a particular row of memory cells 112 that is to be written or read. Addressing circuitry facilitates specific access to individual rows of memory cells. For example, address buffer 114 controls column decoders 118, which also include sense amplifiers and input/output circuitry that is coupled to bit lines BL0-BLn. Address buffer 114 also controls row decoders 116 and column decoders 118 for selectably accessing memory cells 112 in response to address signals that are provided on address lines 120 during read and write operations. The address signals are typically provided by an external controller, such as a microprocessor or other memory controller. Each of memory cells 112 has a substantially identical structure and, accordingly, only one memory cell 112 structure is described herein.

In one exemplary mode of operation, circuit 100 receives an address of a particular memory cell 112 at address buffer 114. Address buffer 114 identifies one of the word lines—WL0-WLm and a corresponding one of—R0-Rm of the particular memory cell 112 to row decoder 116. Row decoder 116 selectively activates the particular word line WL0-WLm and a corresponding one of—R0-Rm to activate access transistors 130 of each memory cell 112 that is connected to the selected word line pair—WL0-WLm/R0-Rm. Column decoder 118 selects the one of bit lines BL0-BLn of the particularly addressed memory cell 112. For a write operation, data received by input/output circuitry is coupled to the one of bit lines BL0-BLn and through the access transistor 130 to charge or discharge the storage capacitor 132 of the selected memory cell 112 to represent binary data. For a read operation, data stored in the selected memory cell 112, as represented by the charge on its storage capacitor 132, is coupled to the one of bit lines BL0-BLn, amplified, and a corresponding voltage level is provided to the input/output circuits.

According to one aspect of the invention, each of the first and second gates of access transistor 130 is capable of controlling the conduction between its first and second source/drain terminals, as described below. In this embodiment, parallel switching functionality can be effected between the first and second source/drain terminals of access transistor 130 by independently operating the particular ones of word lines WL0-WLm and corresponding ones of word lines R0-Rm. For example, by independently activating word line WL0 and word line R0, both of which are coupled to the same row of memory cells 112, independently controlled inversion channels can be formed in each corresponding access transistor 130 by respective first and second gates for allowing conduction between the first and second source/drain regions.

According to another aspect of the invention, while each of the first and second gates of access transistor 130 is capable of controlling the conduction between its first and second source/drain terminals, the first and second gates of particular access transistors 130 may be synchronously activated, rather than independently operated. For example, by synchronously activating word line WL0 and word line R0, both of which are coupled to the same row of memory cells 112, synchronous inversion channels can be formed in each corresponding access transistor 130 by respective first and second gates for allowing conduction between the first and second source/drain regions.

In the present embodiment, synchronous activation and deactivation of the first and second gates allows better control over the potential distributions in the access transistor 130 when it is in a conductive state. Synchronous activation and deactivation can be used to obtain-well-controlled, fully depleted operating characteristics of access transistor 130.

In a further embodiment in which the first and second gates are synchronously activated, different activation voltages may be applied to the first and second gates of the access transistor 130. For example, different voltages can be provided to synchronously activated word lines WL0 and R0, thereby providing different activation voltages to the first and second gates of the access transistor 130 to obtain particular desired operating characteristics. Similarly, different deactivation voltages can be applied to the first and second gates of the access transistor 130. For example, different deactivation voltages can be provided to synchronously deactivated word lines WL0 and R0 and corresponding first and second gates of access transistors 130 in order to obtain particular desired operating characteristics.

Figure 5:
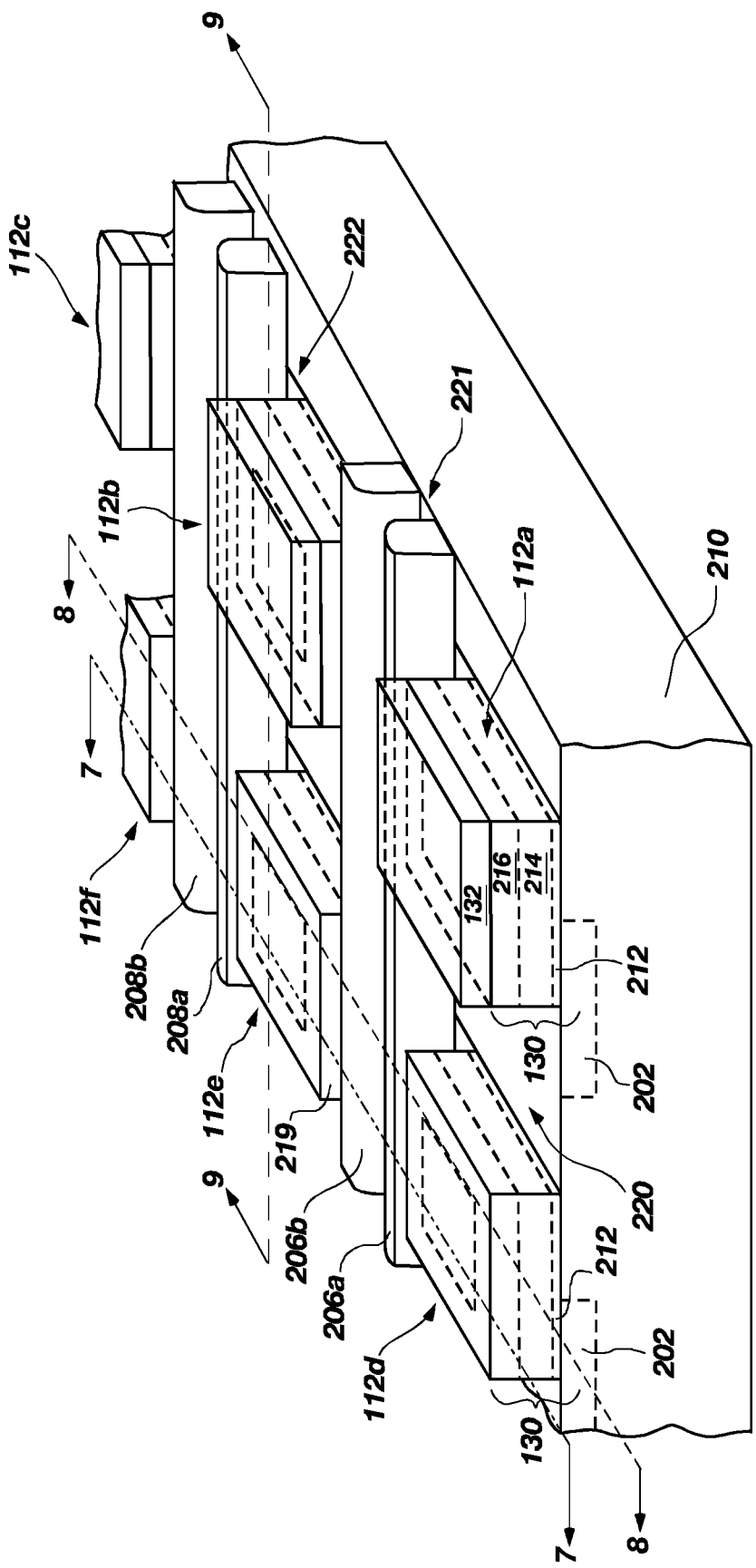
FIG. 5 is a perspective view of a portion of a memory incorporating dual-gated transistors, in accordance with an embodiment of the present invention.

FIG. 5 is a perspective view illustrating generally one embodiment of a portion of a memory, in accordance with an embodiment of the present invention. FIG. 5 illustrates portions of six memory cells 112a-f, including portions of vertically oriented access transistors 130 therein. Conductive segments of bit lines, illustrated herein as buried bit lines 202, represent particular ones of bit lines BL0-BLn (FIG. 4).

In FIG. 5, vertically oriented access transistors 130 are formed in semiconductor pillars that extend outwardly from an underlying substrate 210. Substrate 210 includes bulk semiconductor starting material. In one example embodiment, using bulk silicon processing techniques, access transistors 130 include an n+ silicon layer formed from the bulk silicon substrate 210 to produce first source/drain regions 212 of access transistors 130 and integrally formed n++ conductively doped bit lines 202 defining a particular column of memory cells 112. A-p-silicon layer is formed from the substrate 210 to form the body region 214 of access transistor 130, in which inversion channels may be capacitively generated at the sidewalls of the semiconductor pillar under the control of the first and second gates. A further n+ silicon layer is formed from the substrate 210 to produce second source/drain region 216 of access transistor 130. Storage capacitors 132 are formed on the second source/drain regions 216.

Thus, as seen from FIG. 5, access transistors 130 are formed as semiconductor pillars extending outwardly from substrate 210 and including body regions 214 and first and second source/drain regions 212 and 216. In this embodiment, bit lines 202 are implanted into the bulk semiconductor substrate 210.

Isolation trenches provide isolation between access transistors 130 of adjacent memory cells 112. Columns of memory cells 112 are separated by a trench 220 that is subsequently filled with a suitable insulating material such as silicon dioxide. For example, trench 220 provides isolation between memory cells 112a and 112d and between memory cells 112b and 112e. Rows of memory cells 112 are alternatingly separated by trenches 221 and 222, each of which is separated from substrate 210 by an underlying insulating layer, described below, and separated from the body region 214 of access transistors 130 by a gate oxide, also described below. For example, trench 221 provides isolation between memory cells 112a and 112b and between memory cells 112d and 112e. In addition, trench 222 provides isolation between memory cells 112b and 112c and memory cells 112e and 112f. Trenches 221 and 222 extend substantially orthogonally to bit lines 202.

In the present embodiment, first and second word lines 206 and 208, respectively, are each split into separate conductors. First word line 206 is split into independently operable first word lines 206a and 206b, each disposed in trench 221 and electrically isolated from each other. Second word line 208 is split into independently operable second word lines 208a and 208b, each disposed in trench 222 and electrically isolated from each other, such as by $SiO_2$. Thus, gate regions need not be shared between access transistors 130 in adjacent memory cells 112 on opposing sides of trenches 221 and 222. First and second word lines 206 and 208 can be formed of a refractory metal or n+ polysilicon or other suitable conductor, as described below.

Figure 6:
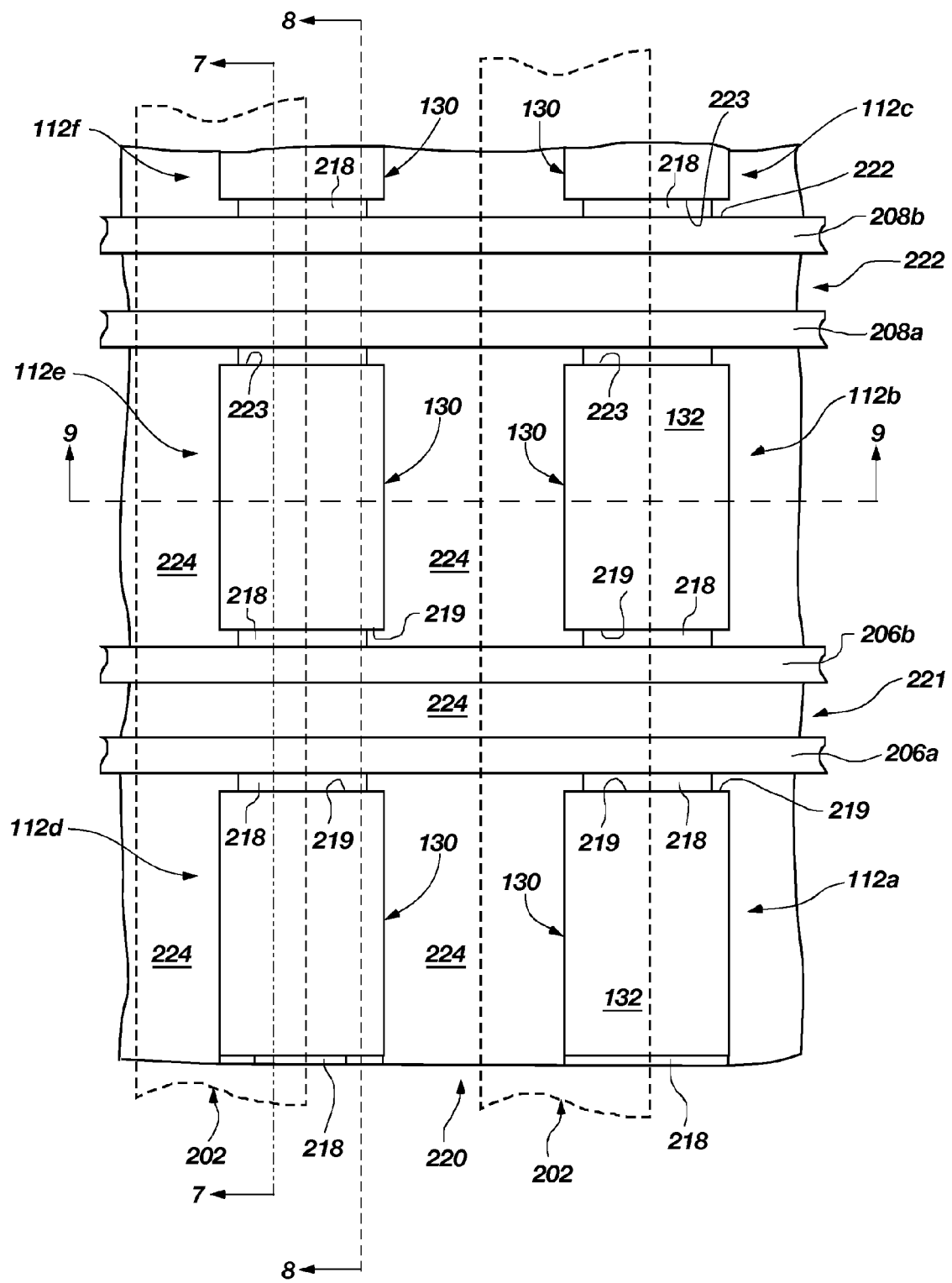
FIG. 6 is a plan view generally illustrating memory cells according to one embodiment of the invention as viewed from above the structures formed on the substrate.

In FIG. 5, a first word line 206a extends in trench 221 adjacent to the vertical sidewalls 219 of the semiconductor pillars of in-line memory cells 112a and 112d, separated therefrom by gate oxide 218 (FIG. 6). First word line 206b extends in trench 221 adjacent to the vertical sidewalls 219 of the semiconductor pillars of in-line memory cells 112b and 112e, separated therefrom by gate oxide 218 (FIG. 6). Second word line 208a extends in trench 222 adjacent to the vertical sidewalls 219 of the semiconductor pillars of in-line memory cells 112b and 112e, separated therefrom by gate oxide 218 (FIG. 6). Second word line 208b extends in trench 222 adjacent to the vertical sidewalls 219 of the semiconductor pillars of in-line memory cells 112c and 112f.

Operation of the access transistor 130 of memory cell 112b, for example, includes operation of the first word line 206b and second word line 208a, as described above. A positive potential is applied to either or both of first word line 206b and second word line 208a, as described above, to turn on the access transistor 130 of memory cell 112b.

The use of split first word lines 206a-b and split second word lines 208a-b avoids the problem of sub-threshold conduction in access transistors 130 in one row while the memory cells 112 in the adjacent row are being addressed. Each memory cell 112 is capable of being uniquely addressed by a combination of first word line 206 and second word line 208 voltages. These voltages need not appear on the first word line 206 and second word line 208 of adjacent rows of memory cells 112.

FIG. 6 is a plan view generally illustrating memory cells according to one embodiment of the invention as viewed from above the structures formed on the substrate, in accordance with an embodiment of the present invention. Specifically, FIG. 6 illustrates generally memory cells 112a-f as viewed from above the structures formed on substrate 210 (FIG. 5). FIG. 6 illustrates subsequently formed insulator, such as isolation material 224, formed in trenches 220 to provide isolation between memory cells 112. In this embodiment, first word line 206 is split into first word line 206a and first word line 206b respectively coupled to first gates of access transistors 130 of memory cells 112a, 112d and second gates of access transistors 130 of memory cells 112b, 112e. First word line 206a is also shared between first gates of other access transistors 130 that are in the same adjacent rows, but coupled to different bit lines 202. First word line 206a is located in trench 221 that extends between the semiconductor pillars of memory cells 112a and 112b. First word line 206a is separated by gate oxide 218 from the vertical sidewalls 219 of the semiconductor pillars on each side of trench 221.

A second word line 208 is split into second word line 208a and second word line 208b respectively coupled to first gates of access transistors 130 of memory cells 112b, 112e and second gates of access transistors 130 of memory cells 112c, 112f. Second word line 208a is also shared between first gates of other access transistors 130 that are in the same adjacent rows but coupled to different bit lines 202. Second word line 208a is located in trench 222 that extends between the semiconductor pillars of memory cells 112b and 112c. Second word line 208a is separated by gate oxide 218 from the vertical sidewalls 223 of the semiconductor pillars on each side of trench 222.

As illustrated in the plan view of FIG. 6, respective first and second word lines 206a/206b and 208a/208b are shared between adjacent memory cells 112. As a result, only one-half the surface line width of each is allocated to each memory cell. The row pitch of each cell, measured from the centerline of first word line 206 to the centerline of second word line 208, can be approximately 2 F, where F is a minimum lithographic feature size. F corresponds to the length and width presented by the surface of a minimum-sized semiconductor pillar in each memory cell 112. The column pitch of each cell, measured between centerlines of bit lines 202, can be approximately 2 F. Thus, the surface area of each memory cell 112 can be approximately 4 $F^2$.

Figure 7:
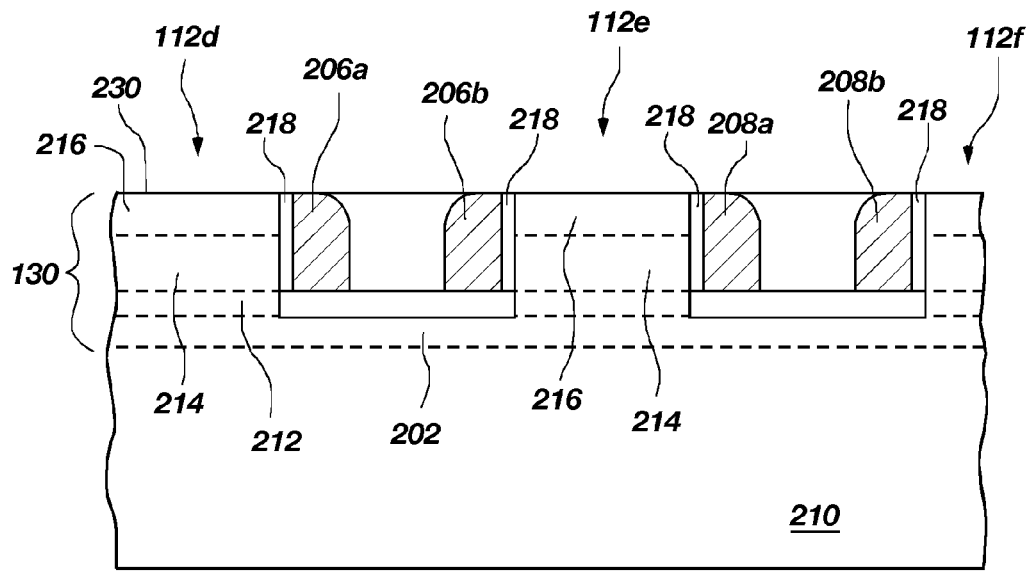
FIG. 7 is a cross-sectional view taken along the section line 7-7 of FIGS. 5 and 6, in accordance with an embodiment of the present invention.

FIG. 7 is a cross-sectional view taken along the section line 7-7 of FIGS. 5 and 6, in accordance with an embodiment of the present invention. In FIG. 7, respective first and second word lines 206a, 206b and 208a, 208b (collectively referred to as 206 and 208, respectively) are buried below the active semiconductor surface 230 of the semiconductor pillar in the memory cells 112d, 112e, 112f (collectively referred to as 112). Active semiconductor surface 230 represents an upper semiconductor portion of second source/drain region 216. First and second word lines 206 and 208, respectively, are isolated from adjacent semiconductor pillars by gate oxide 218. First and second word lines 206 and 208, respectively, provide integrally formed first and second gate portions that are capacitively coupled to adjacent body regions 214 of access transistors 130, such as for forming inversion channel regions therein. A respective bit line 202 is also formed through an implant process and runs the length of the memory cells 112 for that specific column of memory cells 112.

In one embodiment, respective first and second word lines 206 and 208 are formed of a refractory metal, such as tungsten or titanium, or can be formed of n+ doped polysilicon. Similarly, other suitable conductors could also be used for first and second words lines 206 and 208, respectively. First and second word lines 206 and 208 are formed as unitary conductors with first word line 206 being formed in first trench 221 and a unitary conductor second word line 208 formed in second trench 222. The unitary conductor first and second word lines 206 and 208, respectively, are then split into word lines 206a/206b and 208a/208b.

Burying first and second word lines 206a/206b and 208a/208b below active semiconductor surface 230 provides additional space on the upper portion of memory cell 112 for formation of storage capacitors 132 (FIG. 5). Increasing the area available for forming storage capacitor 132 increases the possible obtainable capacitance value of storage capacitor 132. In one embodiment, storage capacitor 132 is a stacked capacitor that is formed using any of the many capacitor structures and process sequences known in the art. Other techniques could also be used for implementing storage capacitor 132. Contacts to the first and second word lines 206 and 208, respectively, can be made outside of the memory cell array 110.

Figure 8:
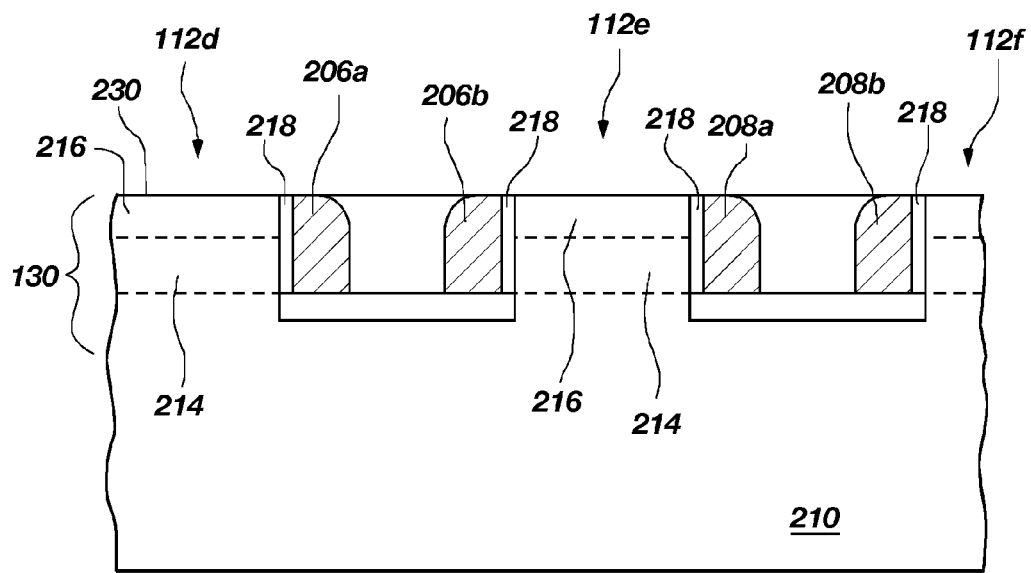
FIG. 8 is a cross-sectional view taken along the section line 8-8 of FIGS. 5 and 6, in accordance with an embodiment of the present invention.

FIG. 8 is a cross-sectional view taken along the section line 8-8 of FIGS. 5 and 6, in accordance with an embodiment of the present invention. In FIG. 8, the section line 8-8 is taken along an offset of a column of memory cells 112 wherein the implanted first source/drain region 212 and the implanted bit line 202 are absent.

Figure 9:
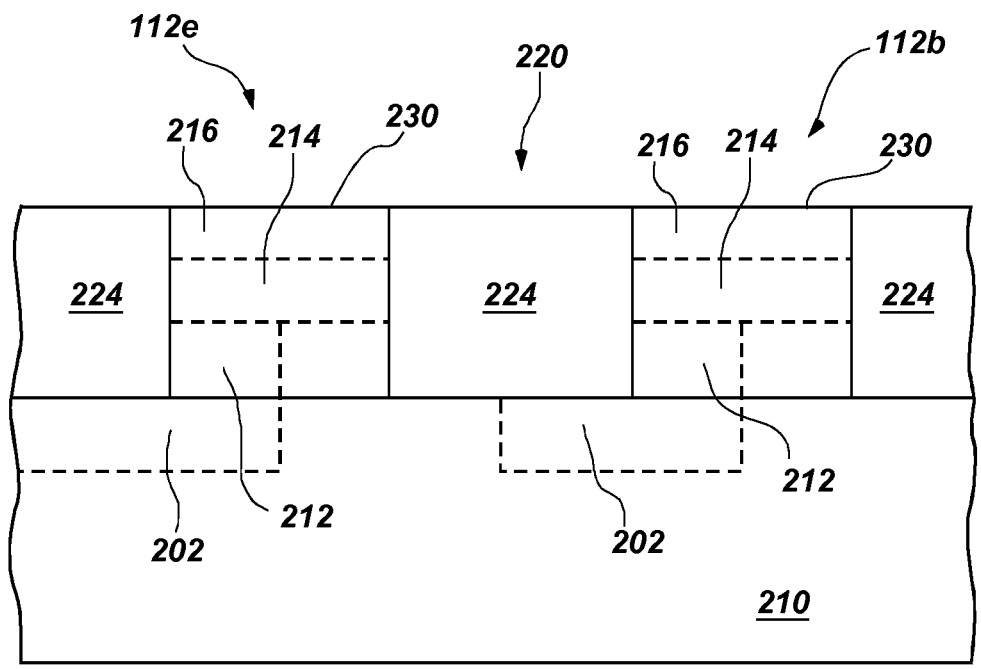
FIG. 9 is a cross-sectional view taken along the section line 9-9 of FIGS. 5 and 6, in accordance with an embodiment of the present invention.

FIG. 9 is a cross-sectional view taken along the section line 9-9 of FIGS. 5 and 6, in accordance with an embodiment of the present invention. In FIG. 9, the section line 9-9 is taken along a cross section of a row of memory cells 112 to illustrate the implanted first source/drain region 212 and the implantation of the bit lines 202. In the present embodiment, an implant process is performed into the trench 220 and concurrently creates first source/drain region 212 and bit line 202. It should be noted that such an implantation process for forming the bit line 202 and the first source/drain region 212 eliminates the more complex and costly processes associated with epitaxial growth as previously used for the formation of bit lines 202 that were formed entirely under the silicon pillar. In the present embodiment, the bit line 202 is offset from the column of vertical memory cells 112 and the first source/drain region 212 is also offset and formed under a portion of the silicon pillar.

Figure 10A:
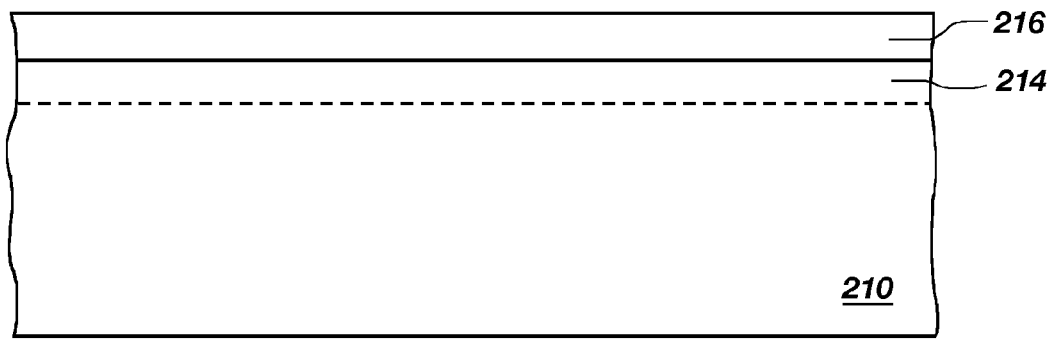
FIGS. 10A-10M describe generally various processing techniques of one embodiment of a method of fabricating memory cells, in accordance with an embodiment of the present invention.

FIGS. 10A-10M describe generally various processing techniques of one embodiment of a method of fabricating memory cells 112, such as shown in FIGS. 5-9, using bulk silicon processing techniques. In the present embodiment, the vertical transistor of memory cell 112 is formed from a silicon pillar that is etched from the substrate 210. As identified above, the vertical transistor of memory cell 112 includes first and second source/drain regions 212 (not shown in FIG. 10A), 216 and a body region 214, all of which are formed from the silicon pillar formed from the substrate 210. A bulk silicon substrate 210 starting material is used. A second source/drain region 216 of n+ silicon is formed, such as by ion-implantation into a body region 214 to a thickness that can be approximately between 0.2 and 0.5 µm. The second source/drain region 216 is formed through ion-implantation of a sheet of n+ implant along the surface of the substrate 210. A body region 214 is defined to a thickness that can be about 0.48 µm and may include a dopant consistent with the bulk silicon substrate 210.

Figure 10B:
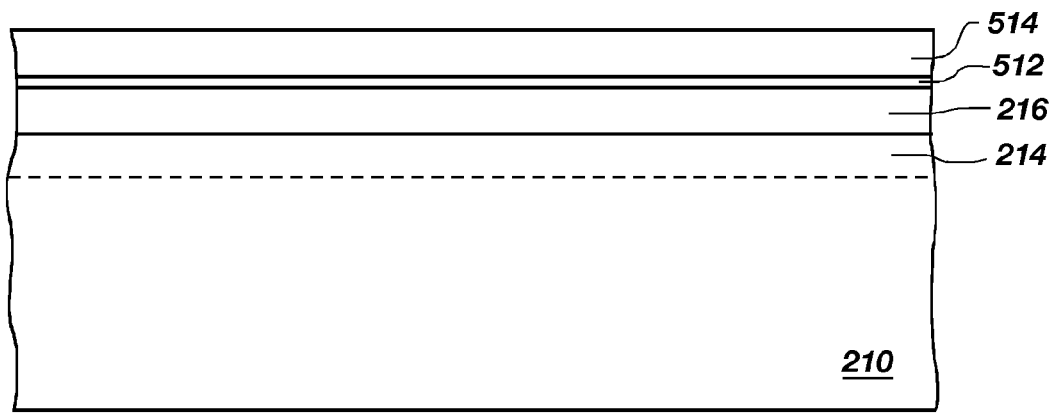

In FIG. 10B, an $SiO_2$ thin pad oxide layer 512 is formed on second source/drain region 216, such as by chemical vapor deposition (CVD). In one embodiment, thin pad oxide layer 512 can be approximately 10 nm in thickness. A thin silicon nitride ($Si_3N_4$) layer 514 is formed on thin pad oxide layer 512, such as by CVD. In one embodiment, silicon nitride layer 514 can be approximately 100 nm in thickness.

Figure 10C:
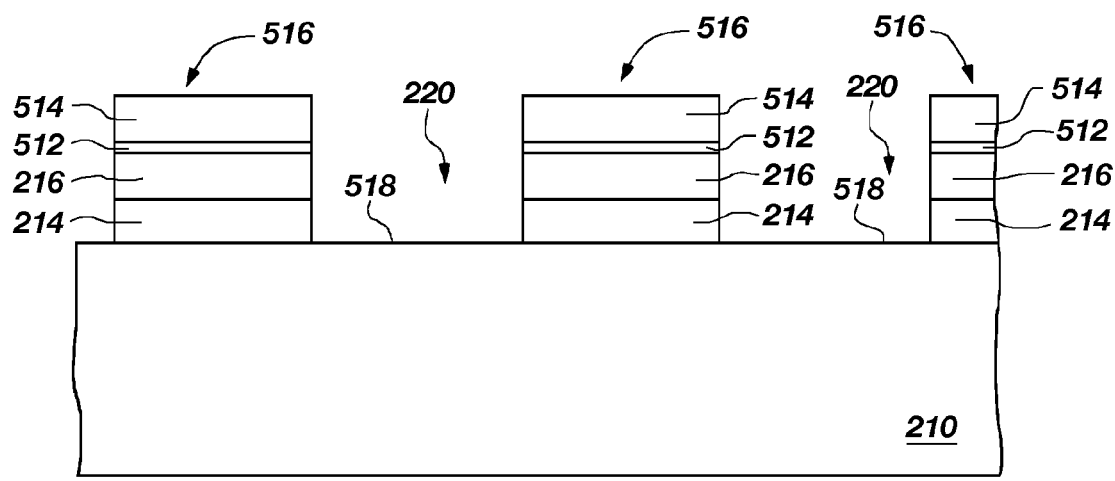

In FIG. 10C, photoresist is applied and selectively exposed to provide a mask for the directional etching of trenches 220, such as by reactive ion etching (RIE). The directional etching results in a plurality of column bars 516 containing the stack of silicon nitride layer 514, thin pad oxide layer 512, second source/drain region 216, and body region 214. Trenches 220 are etched to a depth that is sufficient to reach a surface 518 of substrate 210, defining the bottom of the body region 214. Column bars 516 are oriented in the direction of bit lines 202 (FIG. 5). In one embodiment, column bars 516 have a surface line width of approximately one micron or less. The depth and width of each trench 220 can be approximately equal to the line width of column bars 516.

Figure 10D:
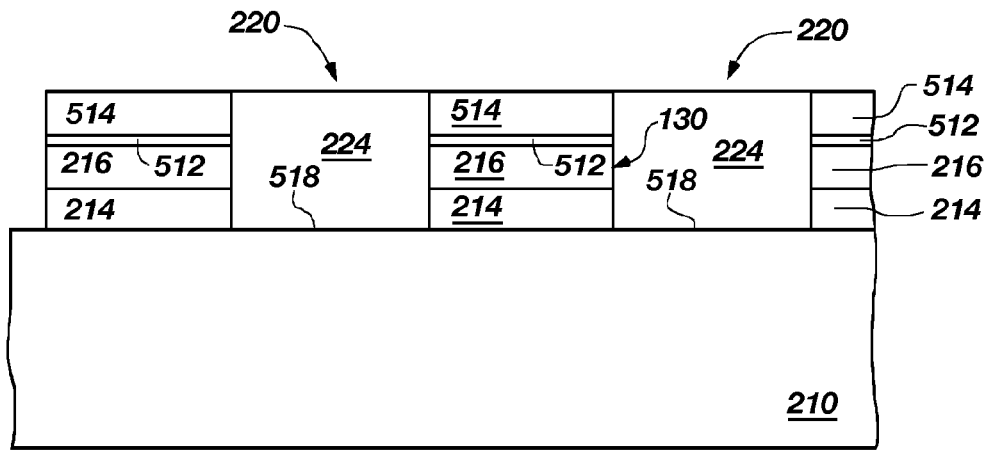

In FIG. 10D, the photoresist is removed. Isolation material 224, such as $SiO_2$, is deposited to fill the trenches 220. The working surface is then planarized, such as by chemical mechanical polishing/planarization (CMP).

Figure 10E:
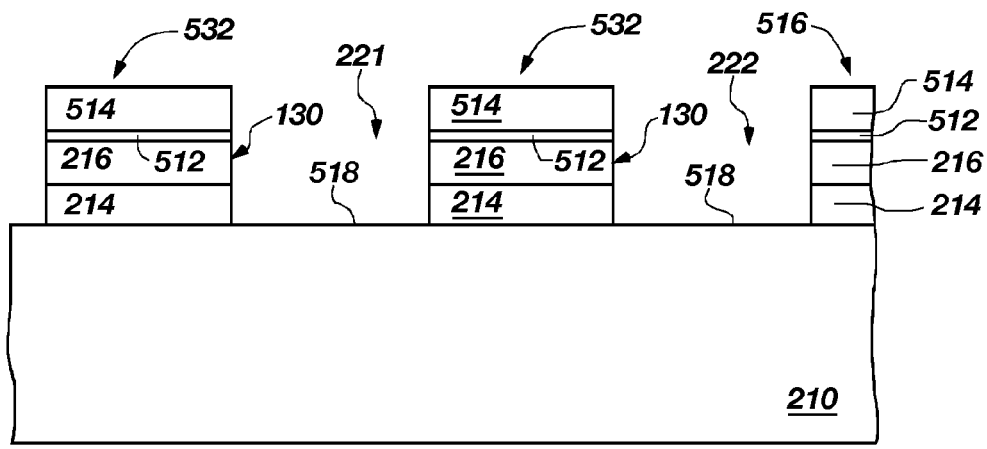

FIG. 10E illustrates the view of FIG. 10D after clockwise rotation by ninety degrees. In FIG. 10E, a photoresist material is applied and selectively exposed to provide a mask for the directional etching of trenches 221 and 222, such as by RIE of a plurality of row bars 532 that is disposed orthogonally to bit lines 202 (FIG. 5). Forming trenches 221 and 222 includes etching though stacked layers in the portions of column bars 516 (FIG. 10C). Forming trenches 221 and 222 also includes etching through the isolation material 224 disposed between column bars 516.

More particularly, trenches 221 and 222 are etched through silicon nitride layer 514, thin pad oxide layer 512, second source/drain region 216, and body region 214. Trenches 221 and 222 are also etched into the isolation material 224 between column bars 516. In one embodiment, after etching silicon nitride layer 514 of column bars 516, a nonselective dry etch is used to remove the isolation material 224 between column bars 516 and also the thin pad oxide layer 512, second source/drain region 216, body region 214, and a portion of first source/drain region 212 (FIG. 10G) of column bars 516. The directional etching of trenches 221 and 222 results in the formation of a plurality of row bars 532 that is orthogonal to column bars 516.

More particularly, trenches 221 and 222 are etched through silicon nitride layer 514, thin pad oxide layer 512, second source/drain region 216, and body region 214. Trenches 221 and 222 are also etched into the isolation material 224 between column bars 516. In one embodiment, after etching silicon nitride layer 514 of column bars 516, a nonselective dry etch is used to remove the isolation material 224 between column bars 516 and also the thin pad oxide layer 512, second source/drain region 216, body region 214, and a portion of first source/drain region 212 (FIG. 10G) of column bars 516. The directional etching of trenches 221 and 222 results in the formation of a plurality of row bars 532 that is orthogonal to column bars 516.

Figure 10F:
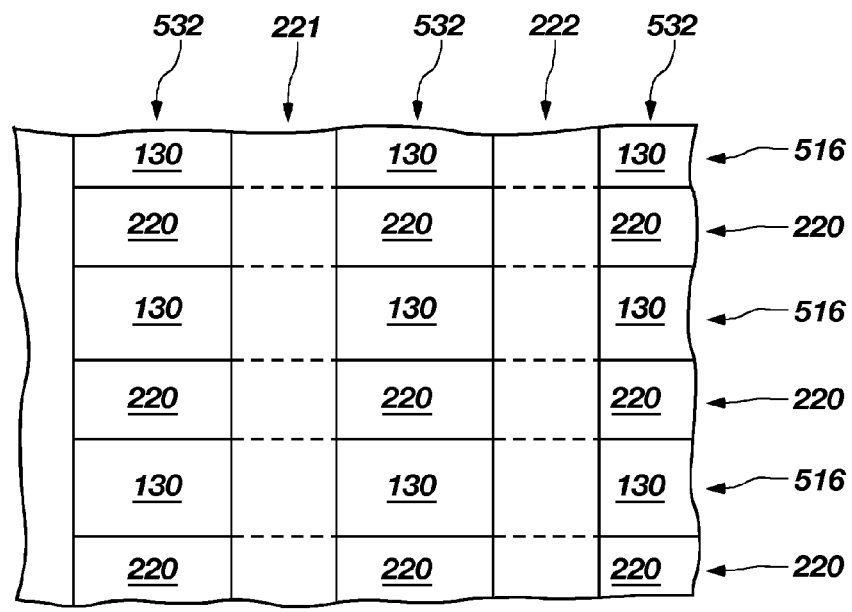
Figure 10G:
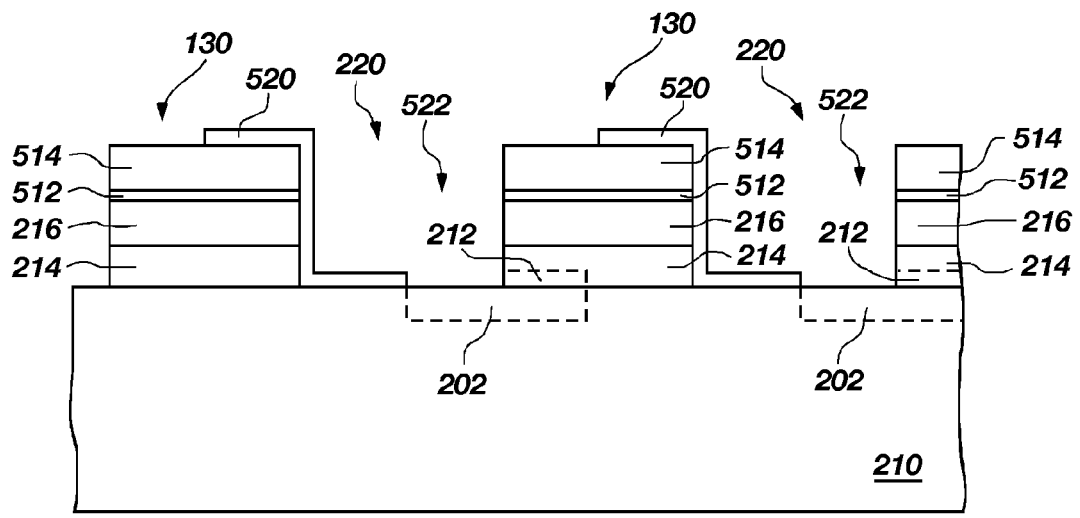

FIG. 10G illustrates the view of FIG. 10F, which is reversed in rotation back to the orientation of FIG. 10C. In FIG. 10G, a masking material 520 is applied and selectively formed to provide a mask on a portion of the top of each access transistor 130 and in a portion of trench 220. An implantation and annealing process 522 forms a buried bit line 202 and the first source/drain region 212. Because of the trenches 221 and 222, the bit line 202 will be narrower when adjacent to the first source/drain region 212 of the access transistor 130 and wider in the trench 221 and 222 areas.

Figure 10H:
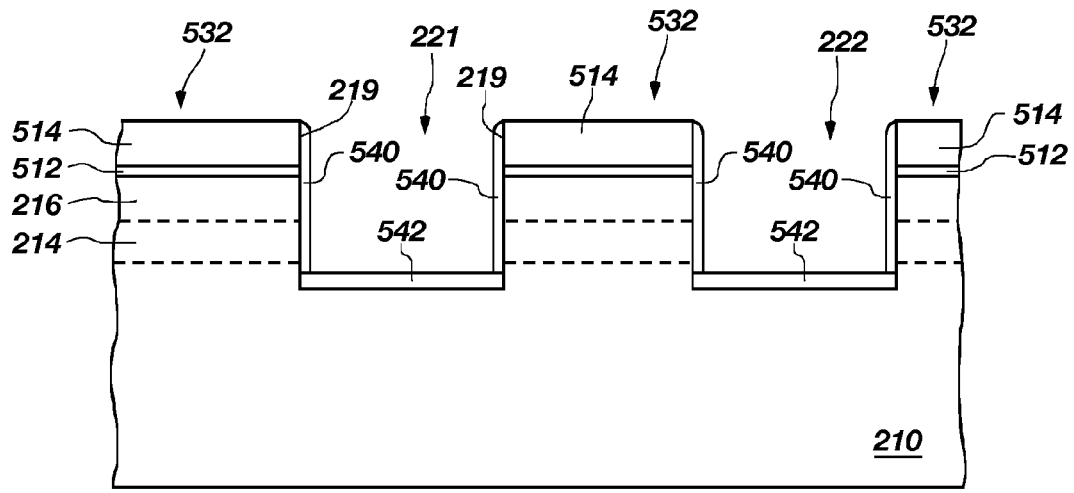

FIG. 10H illustrates the view of FIG. 10F after clockwise rotation by ninety degrees. In FIG. 10H, the masking material 520 (FIG. 10G) is removed and isolation material such as $SiO_2$ is deposited to fill the trenches 220 (FIG. 10G), 221, and 222. The working surface is then planarized, such as by CMP. Trenches 221 and 222 are reopened through an etching process to remove the isolation material and to provide the trenches for the formation of the word lines.

In FIG. 10H, a conformal silicon nitride layer 540 is formed, such as by CVD. Nitride layer 540 is directionally etched, such as by RIE, to leave resulting portions of nitride layer 540 only on vertical sidewalls 219 of the bars 532 in trenches 221 and 222. In one embodiment, the thickness of nitride layer 540 is about 20 nm. An oxide layer 542 is formed, such as by thermal growth, at the base portions of trenches 221 and 222. Oxide layer 542 insulates the underlying bit lines 202 from structures subsequently formed in trenches 221 and 222 and also serves to adjust the height of the vertical transistor gates. After forming oxide layer 542, remaining portions of nitride layer 540 are removed.

Figure 10I:
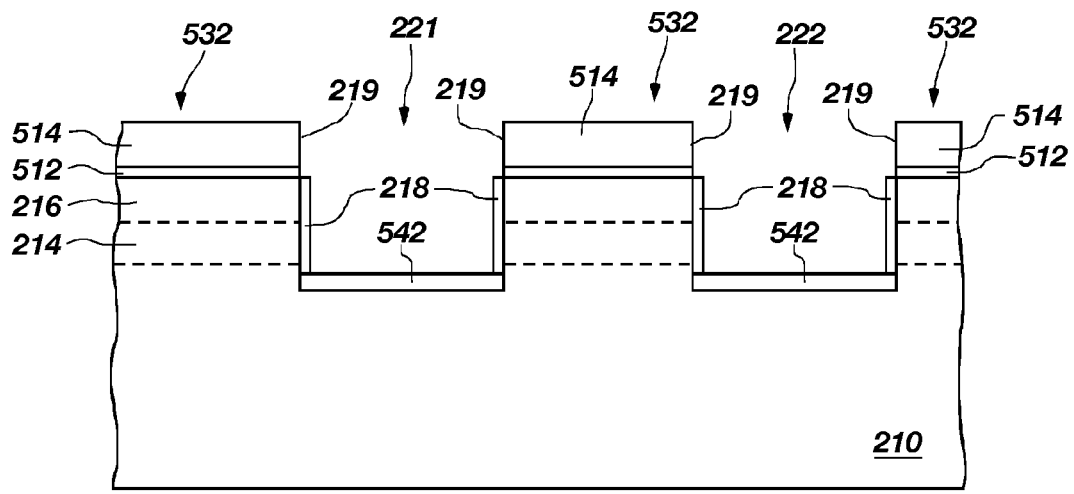

In FIG. 10I, a gate oxide 218 is formed on the exposed vertical sidewalls 219 portions in trenches 221 and 222 of second source/drain region 216 and body region 214. In one embodiment, gate oxide 218 is a high-quality thin oxide layer that is thermally grown on the exposed vertical sidewalls 219 in trenches 221 and 222.

Figure 10J:
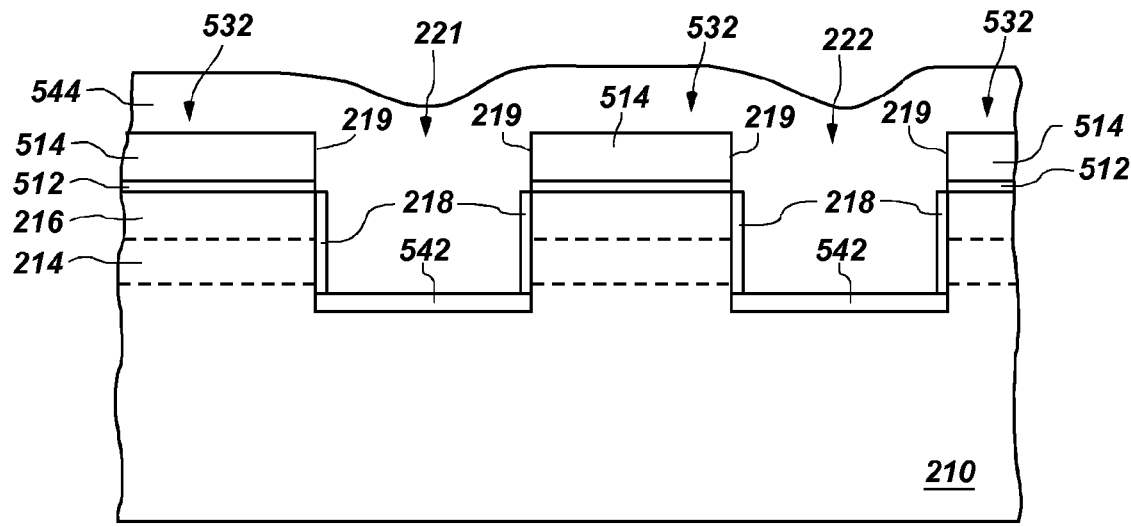

In FIG. 10J, a conductive layer 544 is formed over the working surface of the wafer, including filling trenches 221 and 222 in which respective first and second word lines 206 and 208 will be formed. In one embodiment, layer 544 is formed by CVD of a refractory metal, such as tungsten. In another embodiment, layer 544 is formed by CVD of n+ polysilicon.

Figure 10K:
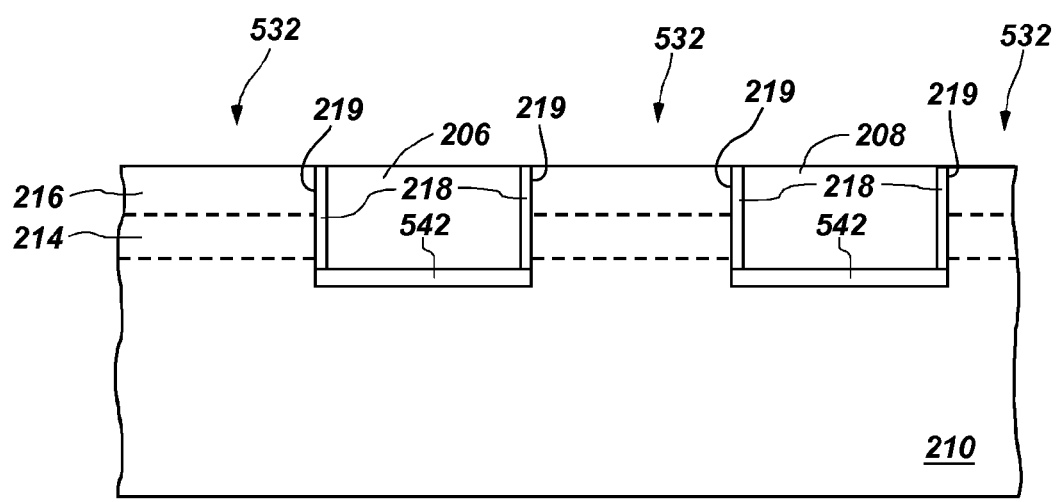

In FIG. 10K, CMP or other suitable planarization process is used to remove portions of layer 544 above the interface between thin pad oxide layer 512 and second source/drain region 216. Thin pad oxide layer 512 and silicon nitride layer 514 are also removed during this planarization step. As a result of the planarization step, first and second word lines 206 and 208 are formed in respective trenches 221 and 222.

Figure 10L:
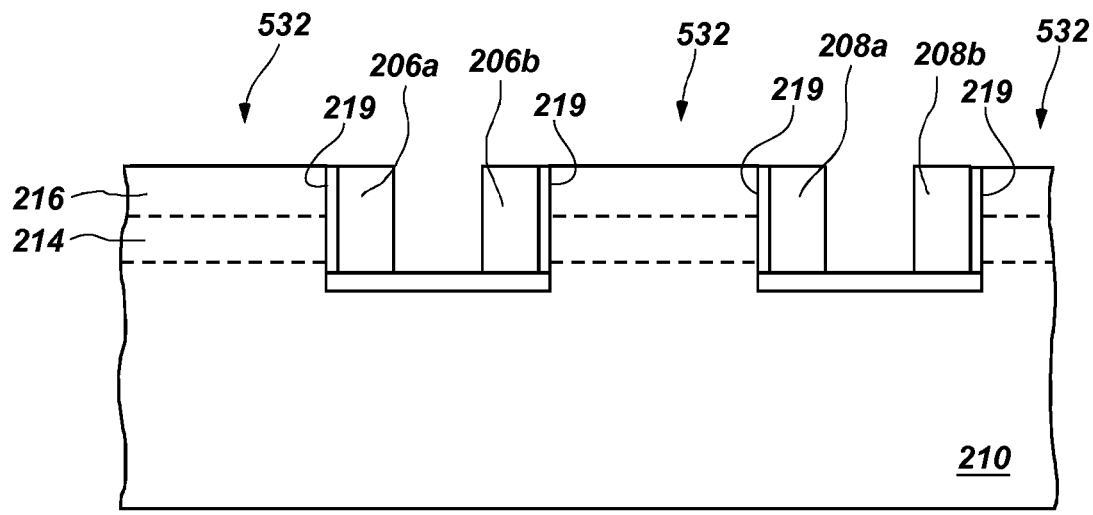

In FIG. 10L, the unitary first and second word lines 206 and 208, respectively, are split to form first and second word lines 206a/206b and 208a/208b. One method for splitting the unitary word lines may include depositing a refractory metal, n+ polysilicon, or other conductor as a conformal fill that can have a thickness of less than or equal to approximately F/3, where F is the minimum feature size. The conformal fill is then directionally etched, thereby leaving resulting split conductor first and second word lines 206a/206b and 208a/208b adjacent to the vertical sidewall 219, separated therefrom by gate oxide 218. An oxide fill is formed between the respective split first and second word lines 206a/206b and 208a/208b.

Figure 10M:
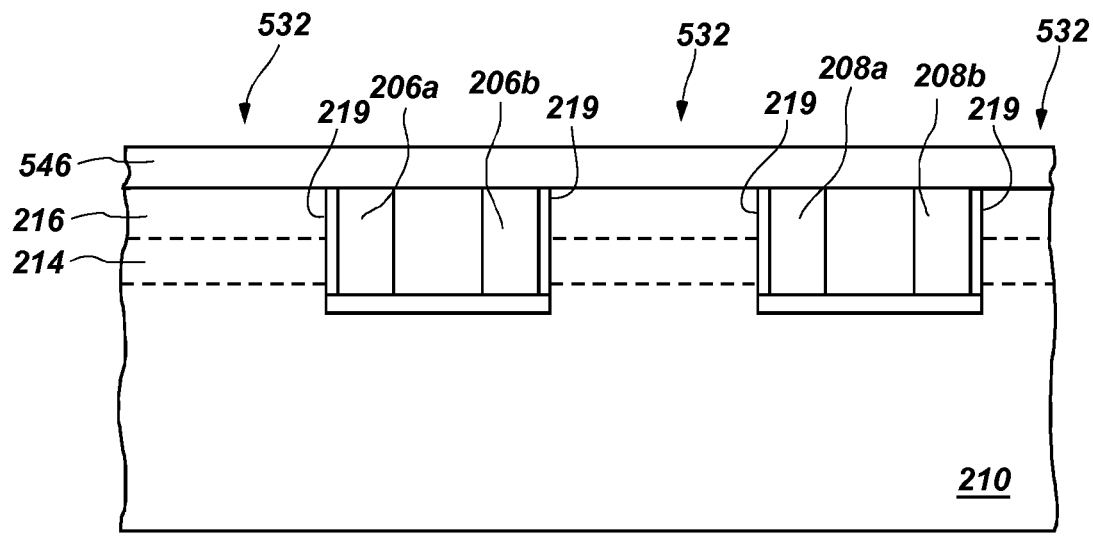

FIG. 10M illustrates one embodiment in which an insulating layer 546, such as SiO$_2$, is formed on the working surface of a wafer, such as by CVD. The structure thus formed is then processed to fabricate a storage capacitor 132 (FIG. 5) on the working surface of the wafer, using known techniques, followed by conventional back end of line (BEOL) procedures.

Figure 11:
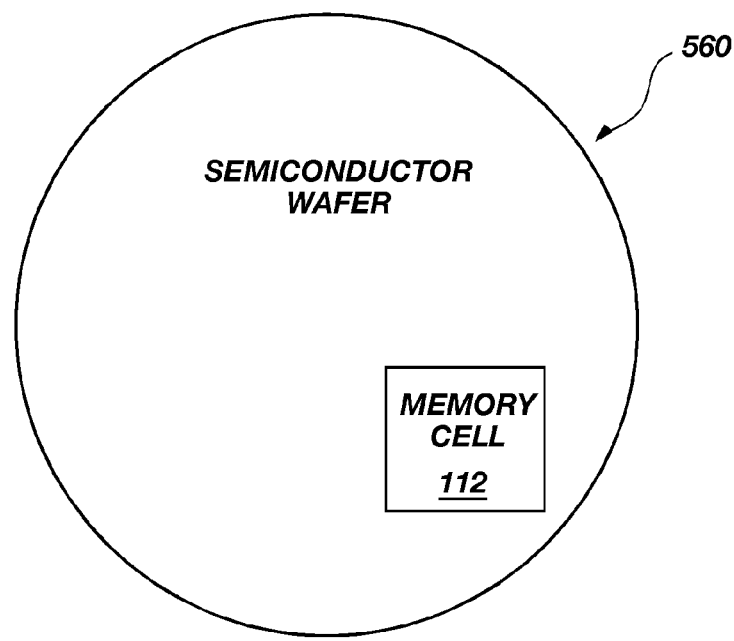
FIG. 11 illustrates a semiconductor wafer including one or more memory cells, in accordance with an embodiment of the present invention.

As shown in FIG. 11, the memory cell 112, as described above, is fabricated on a semiconductor wafer 560. It should be understood that the memory cell 112 may also be fabricated on a wide variety of other semiconductor substrates.

Figure 12:
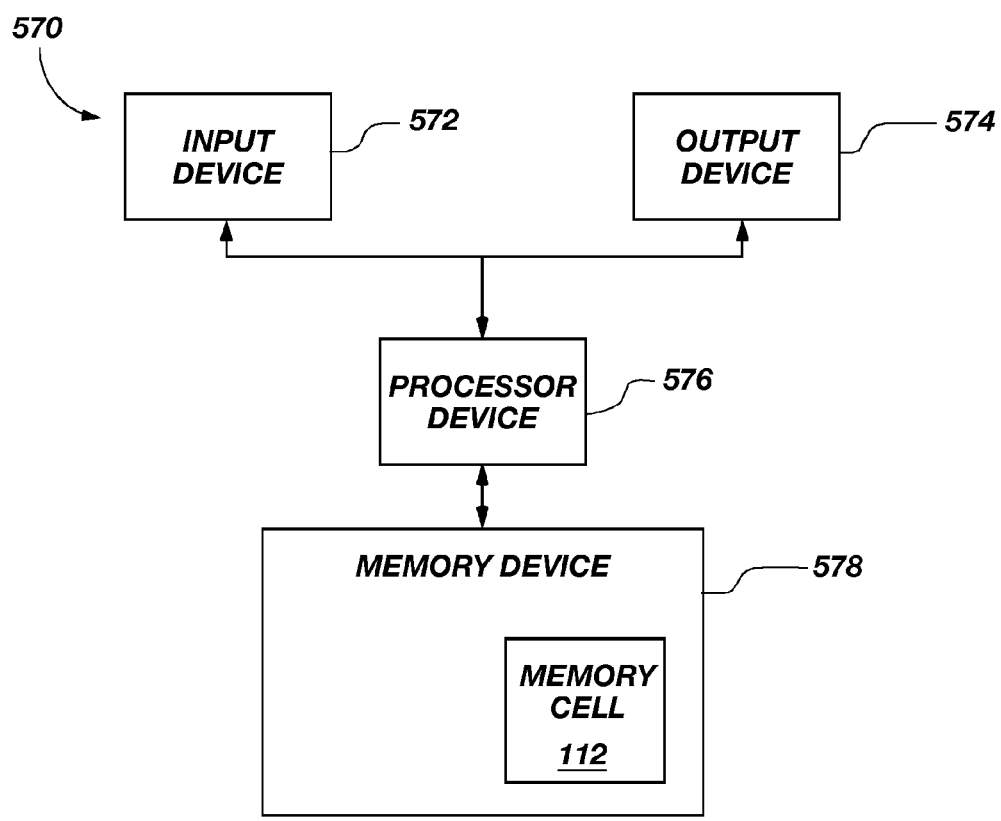
FIG. 12 is a block diagram of an electronic system including one or more memory cells, in accordance with an embodiment of the present invention.

As shown in FIG. 12, an electronic system 570 includes an input device 572, an output device 574, a processor device 576, and a memory device 578 that incorporate the memory cell 112 as described with respect to one or more embodiments of the present invention. Also, it should be noted that the memory cell 112 may be incorporated into any one of the input, output, and processor devices 572, 574, and 576.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of forming a memory cell, comprising:
    forming a pillar of semiconductor material including a plurality of sides and extending outwardly from a general plane of a substrate;
    forming a first source/drain region in the substrate;
    forming an access transistor including a body region and a second source/drain region within the pillar; and
    forming a bit line in the substrate and in conductive contact with the first source/drain region of the access transistor and offsetting the bit line at least partially from the pillar in a direction lateral to the bit line.

2. The method of claim 1, further comprising, extending at least a portion of the bit line beyond an outer edge of one side of the pillar in a direction lateral to the bit line, and wherein at least a portion of another side of the pillar of semiconductor material extends beyond an edge of the bit line.

3. The method of claim 2, further comprising integrally forming the first source/drain region and the bit line.

4. The method of claim 1, further comprising forming a first gate on a first side of the pillar, the first gate configured for attaching to a first word line.

5. The method of claim 4, further comprising forming a second gate on a second side of the pillar, the second gate configured for attaching to a second word line.

6. The method of claim 5, further comprising conductively coupling together the first and second word lines.

7. The method of claim 5, further comprising arranging the first and second gates on opposing first and second sides of the pillar.

8. The method of claim 1, further comprising forming a storage capacitor coupled to the second source/drain region.

9. A method of forming a memory cell, comprising:
    forming a bit line in a substrate;
    forming a pillar of semiconductor material including a plurality of sides and extending outwardly from a general plane of the substrate;
    forming a first source/drain region in the substrate and coupled to the bit line formed in the substrate, wherein forming the bit line includes at least partially offsetting the bit line from the pillar in a direction lateral to the bit line, wherein at least a portion of the bit line extends beyond an outer edge of one side of the pillar, and wherein at least a portion of another side of the pillar extends beyond an edge of the bit line; and
    forming an access transistor including a body region and a second source/drain region within the pillar.

10. The method of claim 9, further comprising integrally forming the first source/drain region and the bit line.

11. The method of claim 9, further comprising forming a first gate on a first side of the pillar, the first gate configured for attaching to a first word line.

12. The method of claim 11, further comprising forming a second gate on a second side of the pillar, the second gate configured for attaching to a second word line.

13. The method of claim 12, further comprising conductively coupling together the first and second word lines.

14. The method of claim 13, further comprising arranging the first and second gates on opposing first and second sides of the pillar.

15. The method of claim 9, further comprising forming a storage capacitor coupled to the second source/drain region.

16. A method of forming a memory device, comprising:
    forming an array of memory cells, forming each memory cell including:
        forming a pillar of semiconductor material extending outwardly from a general plane of a substrate, the pillar including a plurality of sides;
        forming a first source/drain region formed in the substrate; and
        forming an access transistor including a body region and a second source/drain region within the pillar, the access transistor further including the first source/drain region, the access transistor including at least a first gate on a first side of the pillar;
    forming a plurality of bit lines in the substrate such that each of the plurality of bit lines is in conductive contact with the first source/drain region of the access transistor of at least a plurality of memory cells in a common column of the array and offsetting each bit line in a direction lateral to the bit line at least partially from the pillar of at least one memory cell in the array of memory cells; and forming a plurality of word lines disposed generally orthogonal to the plurality of bit lines, the plurality of word lines coupled to each first gate of each memory cell immediately adjacent to each of the plurality of word lines.

17. The method of claim 16, wherein each of the first source/drain region of each of the plurality of memory cells and a corresponding one of the plurality of bit lines are integrally configured.

18. The method of claim 16, wherein each of the memory cells further comprises a second gate on a second side of the pillar, the second gate configured for attaching to one of a plurality of the second gates of memory cells immediately adjacent to another one of the plurality of word lines.

19. The method of claim 18, wherein the ones of the plurality of word lines coupled to the first gate and the second gate of the memory cell are coupled together.

20. A method of forming a vertical memory cell, comprising:

forming a pillar extending outwardly from an integrally connected semiconductor substrate;

forming a first source/drain region in the substrate and coupled to a bit line formed in the substrate, wherein the bit line is at least partially offset from the pillar in a direction lateral to the bit line, wherein at least a portion of the bit line extends beyond an outer edge of one side of the pillar, and wherein at least a portion of another side of the pillar extends beyond an edge of the bit line;

forming a body region and a second source/drain region formed within the pillar;

forming a first gate coupled to a first side of the pillar and an independent second gate coupled to a second side of the pillar for electrically coupling together the first and second source/drain regions when activated, the first gate and the second gate being differently activated by separate and different activation voltages; and forming a storage capacitor formed on an extended end of the pillar and electrically coupled to the second source/drain region.

* * * * *